United States Patent [19]

Nishino

[11] Patent Number: 5,708,723

[45] Date of Patent: Jan. 13, 1998

[54] RECORDING AND REPRODUCING APPARATUS FOR AUDIO SIGNAL

[75] Inventor: Yasuji Nishino, Tokyo, Japan

[73] Assignee: Sony Corporation, Tokyo, Japan

[21] Appl. No.: 697,780

[22] Filed: Aug. 29, 1996

[30] Foreign Application Priority Data

Sep. 11, 1995 [JP] Japan .................................. 7-258157

[51] Int. Cl.$^6$ .................................................. H03G 5/00

[52] U.S. Cl. .................................. 381/101; 381/98

[58] Field of Search ........................ 381/98, 101, 102, 381/103; 369/7

[56] References Cited

U.S. PATENT DOCUMENTS

| | | | |
|---|---|---|---|
| 5,028,883 | 7/1991 | Itoh et al. | 381/101 |
| 5,241,696 | 8/1993 | Mori et al. | 381/101 |
| 5,448,534 | 9/1995 | Okada | 369/7 |

Primary Examiner—Curtis Kuntz
Assistant Examiner—Vivian Chang
Attorney, Agent, or Firm—Jay H. Maioli

[57] ABSTRACT

A recording and reproducing apparatus for an audio signal including a low pass filter removing high frequency components of a predetermined frequency or more of an audio signal having a wide band, an A/D conversion circuit converting the audio signal from the low pass filter into a digital signal, a memory for storing in order to record a predetermined period of time of the digitized audio signal from the A/D conversion circuit, a D/A conversion circuit converting the audio signal read from the memory into an analog signal, a tone control circuit conducting a frequency correction on the audio signal, and a control circuit controlling the tone control circuit such that, with respect to the audio signal recorded in the memory or the audio signal read from the memory low frequency components of the audio signal to be reproduced are attenuated in correspondence with the high frequency components of the audio signal which have been removed by the low pass filter whereby the audio signal with no conspicuous unnaturalness can be reproduced.

2 Claims, 7 Drawing Sheets

RECORDING AND REPRODUCING APPARATUS FOR AUDIO SIGNAL

BACKGROUND OF THE INVENTION

1. Field of the Invention

The present invention relates to a recording and reproducing apparatus for an audio signal having a wide band of frequencies, for example, those in FM (frequency modulated) radio broadcasting, to a semiconductor memory after limiting the band thereof and reproducing the stored signal.

2. Description of Related Art

In recent years, a device using a semiconductor memory as a record medium in the case where recording of an audio signal of about several minutes in length is carried out when it is not necessary to record an audio signal for a long period of time ranging from several tens of minutes to several hours as in, for example, a cassette tape.

For example, in the case of an automatic answering telephone set, a time period for almost all the vocal message to be recorded from the other party who has made a telephone call elapses in about several tens of seconds. For that purpose, an automatic answering telephone set using a semiconductor memory capable of recording a plurality of vocal messages each of about several tens of seconds as a record medium of the vocal message, has been provided.

When an audio signal of a comparatively long period of time of, for example, about several minutes is recorded in such a semiconductor memory, the audio signal is generally recorded after limiting the band thereof into a narrow band of, for example, up to 1.5 kHz. In this way it is possible to record an audio signal of a comparatively long period of time in a semiconductor memory having a limited memory capacity.

According to the above-mentioned automatic answering telephone set, the frequency characteristic of the telephone set per se, is provided with a characteristic of a narrow band of several 100 through 3 kHz as illustrated in FIG. 6A.

Therefore, in the case of the above-mentioned automatic answering telephone set using a semiconductor memory as a record medium, the audio signal such as a vocal message of which the band has been limited, for example, of which the cut-off frequency is set to 1.5 kHz, is A/D-converted and recorded in the semiconductor memory (refer to FIG. 6B) and even if the audio signal is reproduced as it is, the low frequency side thereof is removed in correspondence with the high frequency side thereof and therefore, the audio signal can be reproduced with no conspicuous unnaturalness (refer to FIG. 6C).

As described above, a semiconductor memory can record an audio signal of a comparatively long period of time of about several minutes, it can be repeatedly used in recording and reproducing and further, it is extremely small-sized and therefore, it has been incorporated in various kinds of devices as a record medium of an audio signal.

For example, it has been conceived in a FM radio receiver etc. that the above-mentioned semiconductor memory is used as a record medium for recording and reproducing information of a comparatively short period of time such as news program, weather forecast or traffic information. In this case, even if the audio signal is provided with a wide band in which the frequency characteristic ranges to as far as 15 kHz as in the audio signal in an FM radio broadcasting as illustrated in FIG. 7A, when it is recorded in the semiconductor memory as described above, the high frequency region of the audio signal of, for example, 1.5 kHz or more must be removed as shown by FIG. 7B.

That is, when a signal having a wide band is recorded as it is in a semiconductor memory having a predetermined memory capacity, in order to accurately A/D-convert and record the high frequency region of the audio signal, a sampling clock having a high frequency must be used, the amount of data to be recorded is increased and a time period capable of recording the audio signal to the semiconductor memory is shortened. Hence, the recording of the audio signal of a comparatively long period of time of about several minutes is made possible by removing the high frequency region of the audio signal of, for example, 1.5 kHz or more.

However, when the audio signal is recorded to the semiconductor memory after removing its high frequency region as shown by FIG. 7B and the signal is reproduced, the high frequency components as illustrated by a dotted line in FIG. 7C are removed from the original audio signal and the audio signal in which only the low frequency components remain, is reproduced. The audio signal in which the high frequency components are removed and only the low frequency components are reproduced in this way, produces an unnatural sound where the low frequency region is significantly and excessively conspicuous and the clarity is deteriorated and which is difficult to hear.

SUMMARY OF THE INVENTION

In view of the above-mentioned drawback, it is an object of the present invention to provide a recording and reproducing apparatus for an audio signal capable of reproducing an audio signal recorded in a semiconductor memory as an audio signal having a clear and natural auditory feeling.

In order to resolve the above-mentioned problem, according to a first aspect of the present invention there is provided a recording and reproducing apparatus for an audio signal comprising:

a low pass filter removing high frequency components of a predetermined frequency or more of an audio signal having a wide band;

an A/D conversion circuit converting the audio signal from the low pass filter into a digital signal;

storing means for storing to record a predetermined period of time of the digitized audio signal from the A/D conversion circuit;

a D/A conversion circuit converting the audio signal read from the storing means into an analog signal;

a tone control circuit provided at a previous stage in respect of the A/D conversion circuit or at a later stage in respect of the D/A conversion circuit and performing a frequency correction on the audio signal; and a control circuit controlling the tone control circuit such that with respect to the audio signal recorded in the storing means or the audio signal read from the storing means low frequency components of the audio signal to be reproduced are attenuated in correspondence with the high frequency components of the audio signal which have been removed by the low pass filter.

According to the first aspect of the recording and reproducing apparatus for an audio signal, in reproducing the audio signal recorded in the memory, the tone control circuit corrects the low frequency components with respect to the audio signal that is read from the memory and converted into the analog signal in accordance with the high frequency components removed by the low pass filter. In this way the audio signal that is well balanced in respect of both the high frequency region and the low frequency region thereof is reproduced.

Further, according to a second aspect of the present invention there is provided a recording and reproducing apparatus for an audio signal comprising:

a receiving circuit demodulating an audio signal by receiving and selecting a radio broadcast wave;

an electric field strength detecting circuit detecting an electric field strength of the radio broadcast wave received and selected by the receiving circuit;

a first tone control circuit performing a frequency correction on at least a low frequency region of the audio signal demodulated by the receiving circuit in accordance with a result of detecting the electric field strength;

a low pass filter removing high frequency components of a predetermined frequency or more of the demodulated audio signal;

an A/D conversion circuit converting the audio signal from the low pass filter into a digital signal;

storing means for storing to record a predetermined period of time of the digitized audio signal from the A/D conversion circuit;

a D/A conversion circuit converting the audio signal read from the storing means into an analog signal;

a second tone control circuit provided at a previous stage in respect of the low pass filter and conducting a frequency correction on the audio signal such that low frequency components thereof are attenuated; and a control circuit controlling the second tone control circuit with respect to the audio signal recorded in the storing means in consideration of the frequency correction on the audio signal performed in the first tone control circuit and the high frequency components of the audio signal removed by the low pass filter based on the result of detecting the electric field strength.

According to the second aspect of the recording and reproducing apparatus for an audio signal, the control circuit controls the second tone control circuit to perform the frequency correction in consideration of the frequency correction that is carried out in the first tone control circuit and the high frequency components of the audio signal that are removed by the low pass filter in accordance with the electric field strength of the received and selected radio broadcast wave which is detected by the electric field strength detecting circuit. The audio signal that is well balanced in respect of both the high frequency region and the low frequency region as a result of the frequency correction, is recorded to the memory.

DETAILED DESCRIPTION OF THE PREFERRED EMBODIMENTS

An explanation will be given of embodiments where a recording and reproducing apparatus for an audio signal in accordance with the present invention is applied to a radio receiver capable of receiving FM radio broadcasting in reference to the drawings as follows. Incidentally, the explanation will be given to the FM radio receiver in these embodiments as a monaural type radio receiver to simplify the explanation, however, the present invention is naturally applicable to a stereo type radio receiver.

Figure 1:
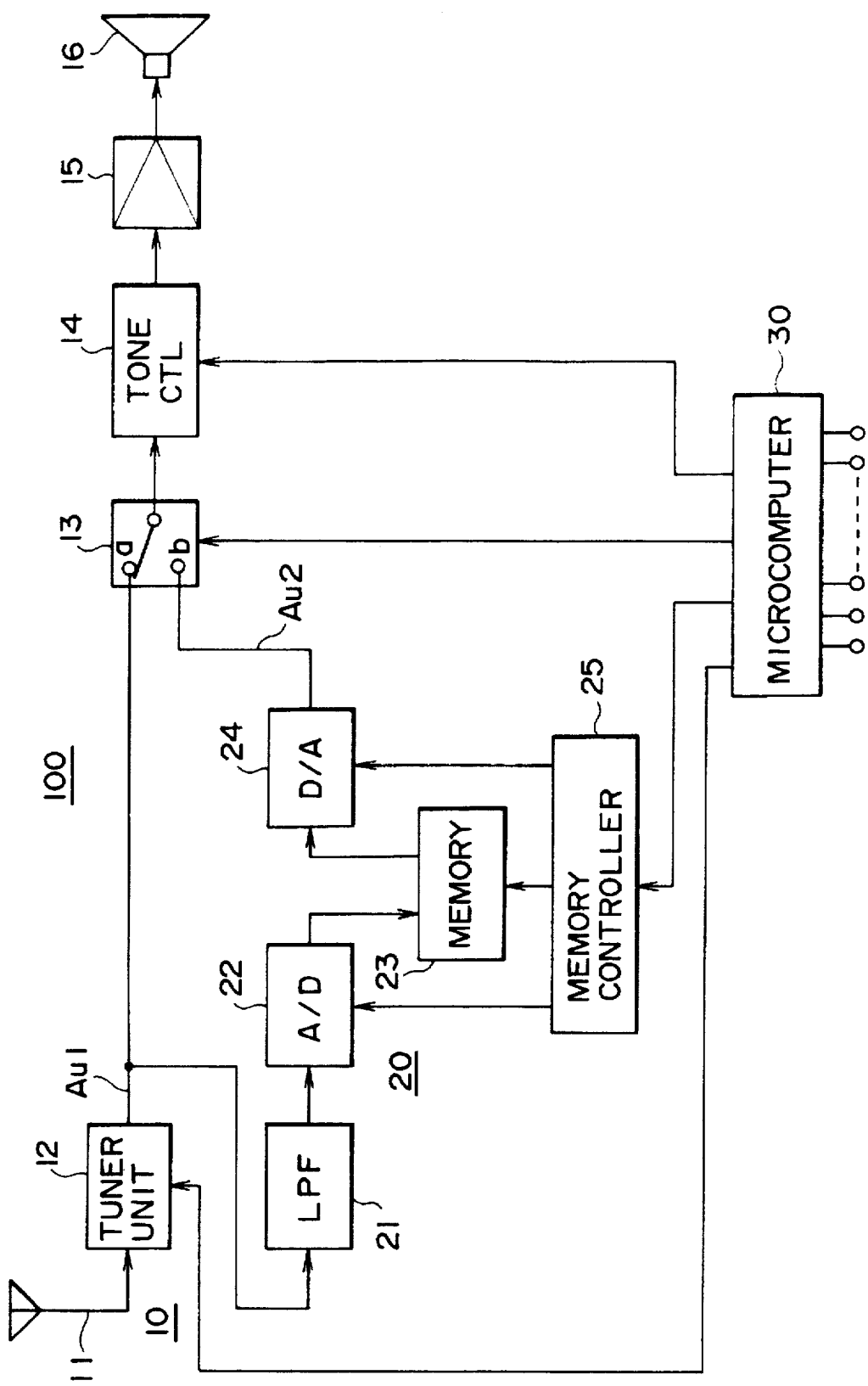
FIG. 1 is a block diagram for explaining an embodiment of a recording and reproducing apparatus for audio signal according to the present invention.

FIG. 1 is a block diagram for explaining a FM radio receiver to which the present invention is applied. As shown in FIG. 1, a radio receiver 100 in this case comprises a receiving unit 10 constituted by an antenna 11, a tuner unit 12, a switch circuit 13, a tone control circuit 14, an amplifier circuit 15 and a speaker 16, a recording and reproducing unit 20 constituted by a low pass filter (hereinafter, abbreviated simply as LPF) 21, an A/D conversion circuit 22, a semiconductor memory (hereinafter, simply memory) 23, a D/A conversion circuit 24, a memory controller 25 and a microcomputer 30 controlling various portions of the radio receiver 100.

The antenna 11 receives a broadcasting wave of an FM radio broadcasting and feeds the receiving signal to the tuner unit 12. Upon receiving a supply of station selecting information from the microcomputer 30 in accordance with an instruction input from a user, the tuner unit 12 selects the desired object of a FM radio broadcasting wave, converts the wave into an intermediate frequency signal, amplifies and demodulates the intermediate frequency signal and outputs an audio signal Au1.

According to this embodiment, the radio broadcasting to be heard as described above is a FM radio broadcasting and the audio signal Au1 has been demodulated as an audio signal having the frequency characteristic of a wide band ranging up to approximately 15 kHz.

The audio signal Au1 outputted from the tuner unit 12 is fed to one input terminal "a" of the switch circuit 13. Also, a reproduced audio signal Au2 from the recording and reproducing unit 20 is fed to the other input terminal "b" of the switch circuit 13. The switch circuit 13 is switched by a switch signal from the microcomputer 30 in accordance with the selection of mode by a user. That is, the radio receiver 100 in this embodiment is provided with a receiving mode, a recording mode and a reproducing mode. The switch circuit 13 is switched to the side of the input terminal "a" in the case of the receiving mode and the recording mode and the switch circuit 13 is switched to the input terminal "b" in the case of the reproducing mode. The output from the switch circuit 13 is fed to the tone control circuit 14.

Although the tone control circuit 14 performs the tone control (frequency correction) by a control signal from the microcomputer 30, the mode of correction differs in the cases of the receiving mode and the recording mode, and the case of the reproducing mode.

Figure 2:
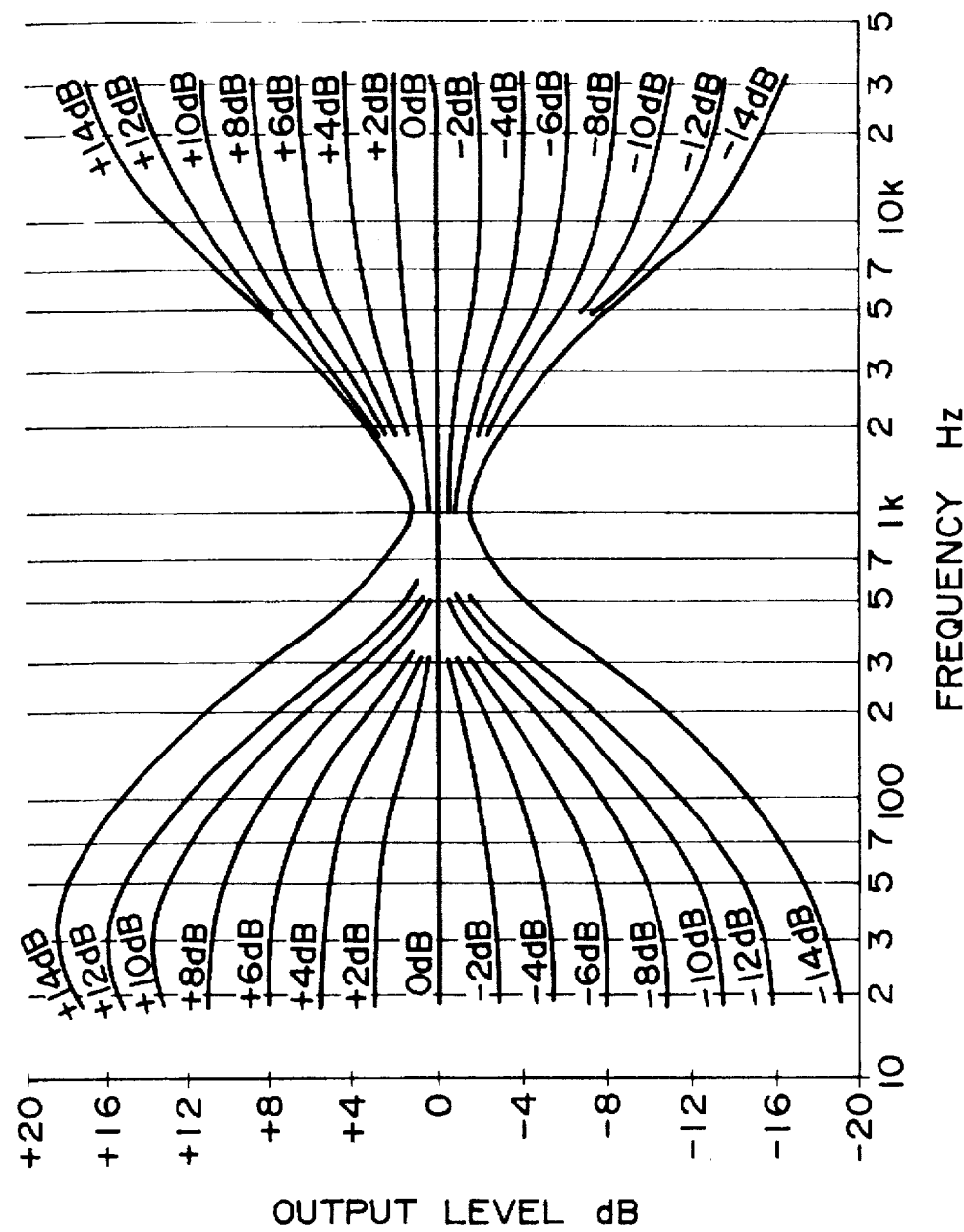
FIG. 2 is a diagram showing the characteristic of a tone control circuit.

The tone control circuit 14 is provided with the tone characteristic as shown by FIG. 2 and performs the tone control (frequency control) with respect to the audio signal that is fed thereto, in the cases of the receiving mode and the recording mode by receiving a supply of tone control information from the microcomputer 30 in accordance with, for example, an instruction input from a user and forms an audio signal having a sound quality in compliance with, for example, the preference of the user.

Further, in the case of the reproducing mode, the tone control circuit 14 performs the frequency correction in accordance with the control signal from the microcomputer 30 with respect to the reproducing signal of the recorded audio signal in which the band has been limited and the high frequency side has been removed such that the low frequency side thereof is removed to make the reproducing signal balanced in view of the frequency characteristic, as mentioned later. In this case, the tone control circuit 14 cuts the low frequency components to produce an attenuation characteristic of, for example, approximately −6 dB to −8 dB at 100 Hz as illustrated in characteristic curves of −6 dB and −8 dB in the characteristic diagram of the tone control circuit 14 of FIG. 2.

The audio signal which has been subjected to the tone control is fed to the speaker 16 via the amplifier circuit 15 where the audio signal or the reproduced audio signal of the broadcast program of a desired FM radio broadcasting is converted into a voice by the speaker 16 whereby a sound is made.

Meanwhile, the audio signal Au1 which has been demodulated by the tuner unit 12 is also supplied to LPF 21 of the recording and reproducing unit 20.

LPF 21 removes the frequency components at a frequency region of, for example, higher than the cut-off frequency of 1.5 Khz from the fed audio signal Au1 and allows only the low frequency components to pass such that the audio signal of a predetermined period of time of, for example, about several minutes can be recorded to the memory 23 having a predetermined memory capacity.

The audio signal of which the band has been limited in this way is supplied to the A/D conversion circuit 22. Upon receiving a supply of clock signals from the memory controller 25, the A/D conversion circuit 22 A/D-converts the supplied audio signal and feeds the audio signal which has become a digital signal to the memory 23.

The memory controller 25 feeds sampling clock signals to the A/D conversion circuit 22 and the D/A conversion circuit 24 and carries out writing control, reading control and addressing control with respect to the memory 23 under the control of the microcomputer 30.

A memory capacity of, for example, several mega bits, for example, 4 mega bits or 8 mega bits, is provided to the memory 23 in which several minutes of the digitized audio signal having the narrow band characteristic, of which the band has been limited as described above, is stored and from which the stored audio data is read under writing and reading control and addressing control by the memory controller 25.

In this embodiment a signal having the sampling frequency of, for example, 4 Khz is used for the sampling clock signals that are used in the A/D conversion or in reading/writing to or from the memory 23 and the change of the audio signal is recorded in the memory 23 by 4 bits since the recording is performed by the DPCM (differential pulse code modulation) system. Therefore, the rate of recording is 4 bit×4 Khz=16 kbps and 16 kilo bits per second or about 1 mega bits per minute of information is recorded in the memory 23.

Further, the memory 23 is provided with a memory capacity of, for example, 4 Mbits through 8 Mbits and therefore, 4 minutes through 8 minutes of the audio signal having a narrow band width can be recorded in the memory 23.

The D/A conversion circuit 24 converts the digital audio signal read from the memory 23 into an analog audio signal Au2 upon receiving a supply of the clock signals from the memory controller 25. The audio signal Au2 is an audio signal in which the band of the high frequency components has been limited by LPF 21 as shown by, for example, FIG. 3. The audio signal Au2 outputted from the D/A conversion circuit 24 is fed to the input terminal "b" of the switch circuit 13 as the output audio signal from the recording and reproducing unit 20.

The microcomputer 30 forms control signals controlling respective portions of the radio receiver 100 in accordance with operational input information that is inputted when a user operates an operation panel (not shown) of the radio receiver 100 and supplies them to the various portions.

Also, the radio receiver 100 in this embodiment is provided with three modes of the receiving mode, the recording mode and the reproducing mode as described above and the respective modes can be selected when the user operates a mode switch key installed at the above-mentioned operation panel.

When, for example, the receiving mode is selected, the switch circuit 13 is switched to output the audio signal Au1 supplied to the side of the input terminal "a" under the control of the microcomputer 30. The tone control circuit 14 performs a normal tone control in accordance with the tone control instruction given by the user by operating the above-mentioned operation panel. Further, as described above the audio signal Au1 from the tuner unit 12 is supplied to the speaker 16 via the switch circuit 13, the tone control circuit 14 and the amplifier circuit 15 where it is converted into a voice whereby a sound is made.

When the recording mode is selected, the memory controller 25 supplies the clock signals to the A/D conversion circuit 22 and performs the writing control and the addressing control with respect to the memory 23 under the control of the microcomputer 30. As a result a predetermined period of time of the audio signal of which the band is limited by LPF 21 and which is digitized by the A/D conversion circuit 22 is recorded in the memory 23.

In this case the switch circuit 13 and the tone control circuit 14 are controlled as in the case where the receiving mode is selected and the audio signal Au1 from the tuner unit 12 is converted into a voice whereby a sound is made from the speaker 16. That is, a predetermined period of time of the audio signal for a voice sound is recorded in the memory 23.

Further, when the reproducing mode is selected, the switch circuit 13 is switched to output the audio signal Au2 that is supplied to the input terminal "b" under the control of the microcomputer 30.

Figure 3:
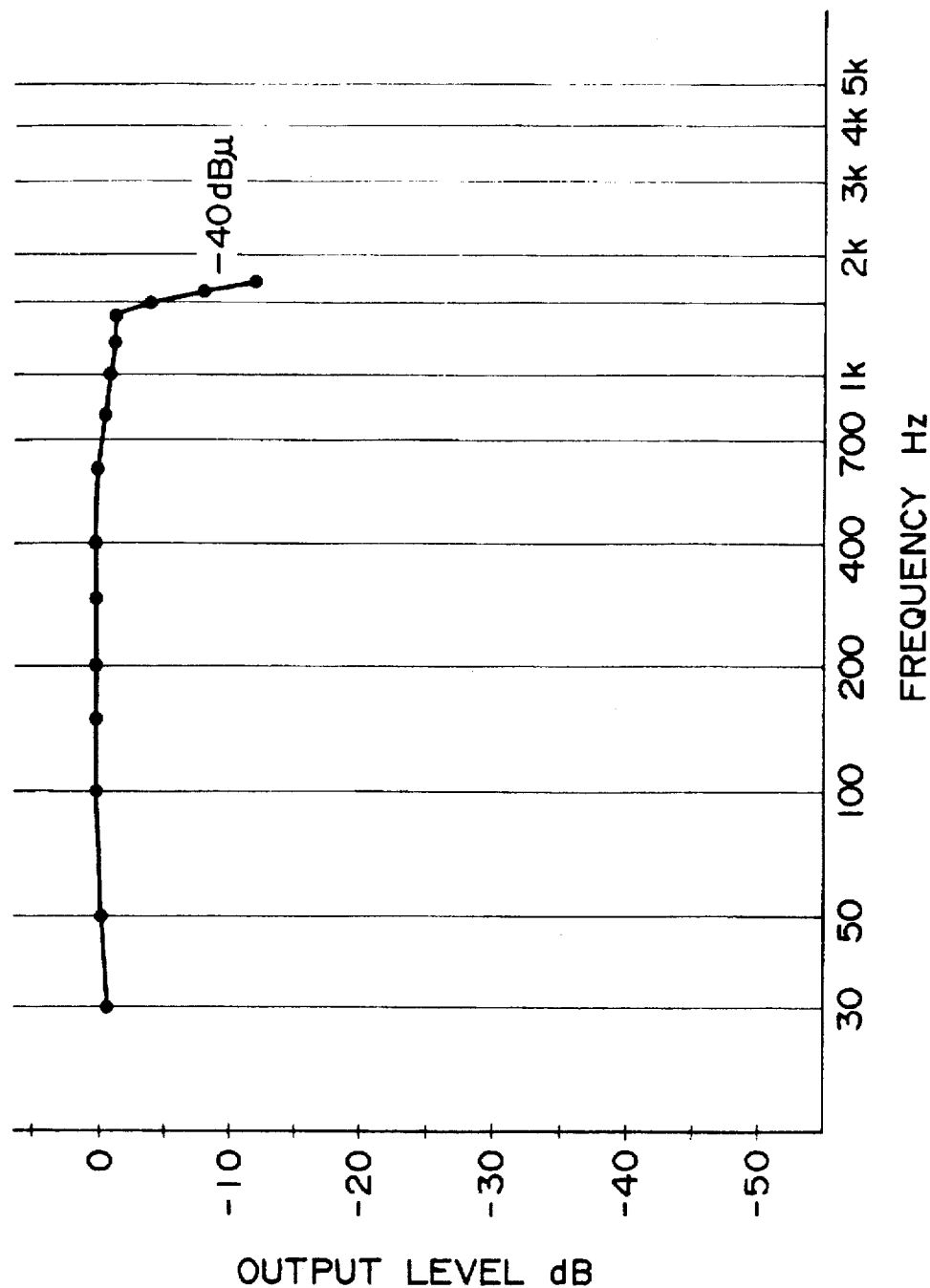
FIG. 3 is a diagram showing the frequency characteristic of an audio signal that is recorded in a semiconductor memory and is reproduced.

The memory controller 25 performs the reading control and the addressing control with respect to the memory 23, reads the audio signal recorded in the memory 23 and supplies it to the D/A conversion circuit 24 under the control of the microcomputer 30. Upon receiving the supply of the clock signals from the memory controller 25, the D/A conversion circuit 24 converts the supplied audio signal to the analog audio signal Au2 and supplies it to the input terminal "b" of the switch circuit 13. The audio signal Au2 becomes the audio signal in which the high frequency components have been removed by LPF 21 as shown by FIG. 3.

The audio signal Au2 is supplied to the tone control circuit 14 via the switch circuit 13. In the tone control circuit 14, a tone control is performed to attenuate the low frequency components with respect to the reproduced audio signal Au2 as described above such that the attenuation characteristic of, for example, −6 dB to −8 dB at 100 Hz as mentioned above is provided whereby the well-balanced audio signal in which both the high frequency region and the low frequency region are automatically attenuated, is formed.

The audio signal Au2 which has been subjected to the tone control at the control circuit 14, is supplied to the speaker 16 via the amplifier circuit 15 by which a voice easy to hear is reproduced.

Figure 4:
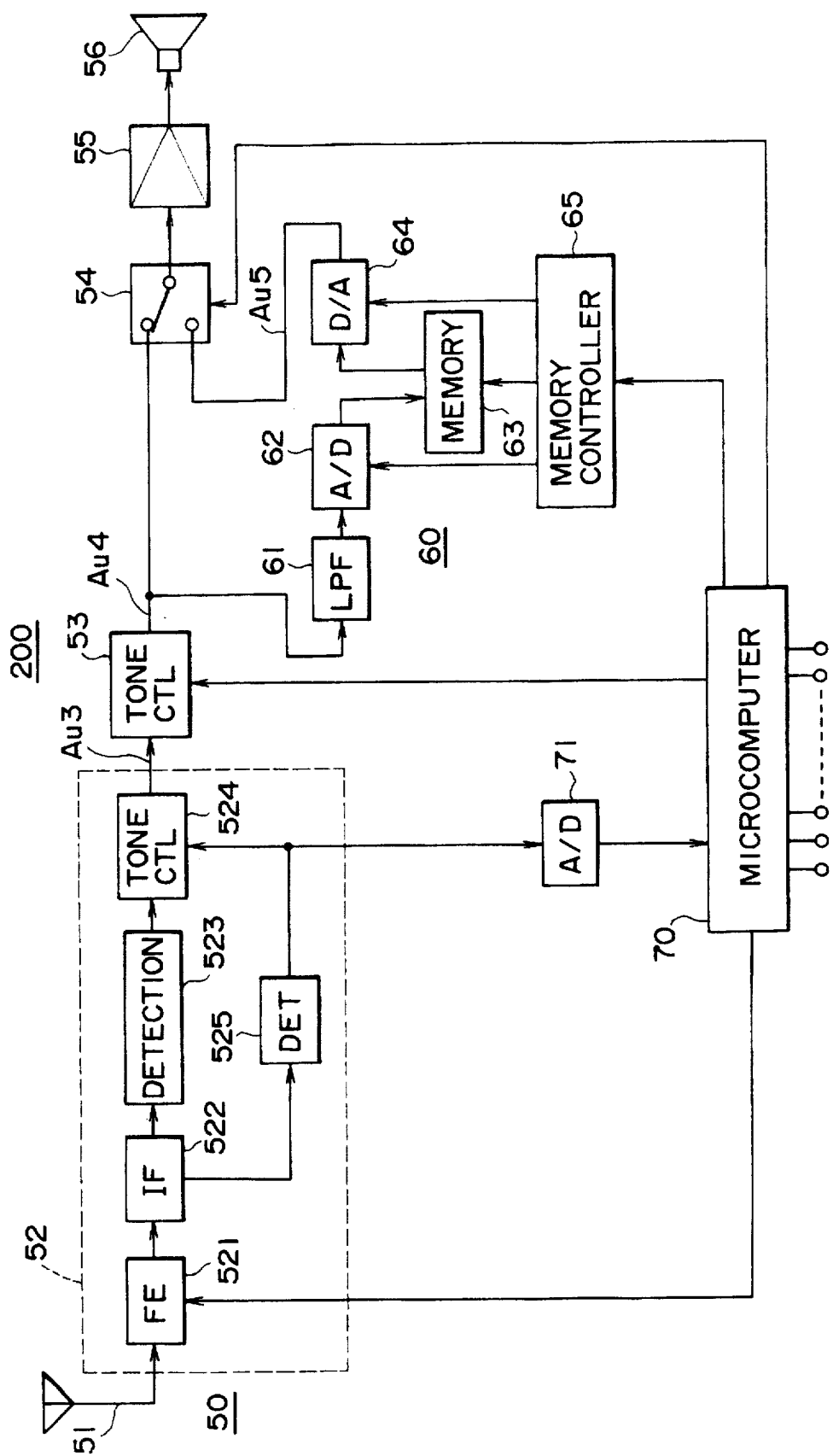
FIG. 4 is a block diagram for explaining another embodiment of a recording and reproducing apparatus for audio signal according to the present invention.

FIG. 4 is a block diagram showing another embodiment of the present invention. This embodiment describes also the case of a FM radio receiver and the radio receiver 200 in this case is provided with a function of detecting the receiving electric field strength and limits of the band of an output signal from a tuner in accordance with the receiving electric field strength whereby the S/N or auditory feeling characteristic can be improved.

The FM radio receiver 200 in this embodiment includes a receiving unit 50 constituted by an antenna 51, a tuner unit 52, a tone control circuit 53, a switch circuit 54, an amplifier circuit 55 and a speaker 56, a recording and reproducing unit 60 constituted by LPF 61, an A/D conversion circuit 62, a memory 63 and a D/A conversion circuit 64, a microcomputer 70 controlling various portions of the radio receiver 200 and an A/D conversion circuit 71.

The tuner unit 52 includes a tone control circuit 524 and an electric field strength detecting circuit 525 detecting the electric field strength of a radio broadcasting signal selected from intermediate frequency signals in addition to a front end circuit 521, an intermediate frequency signal amplifier circuit 522 and a detection circuit 523, and is provided with a function of suppressing the noisy feeling which is enhanced when the electric field of the received and selected radio broadcasting wave is weak as mentioned below.

The recording and reproducing unit 60 is constituted similar to the recording and reproducing unit 20 of the above-mentioned radio receiver 100.

Further, the radio receiver 200 in this embodiment is not provided with a tone control circuit at the later stage in respect of the switch circuit 54, different from the case of the radio receiver 100 in FIG. 1, but instead the tone control circuit 53 is installed immediately after the tuner unit 41.

The tone control circuit 53 is a circuit similar to the tone control circuit 14 in the above-mentioned radio receiver 100 and is provided with the tone characteristic as illustrated in FIG. 2.

The switch circuit 54 corresponds to the switch circuit 13 in the above-mentioned radio receiver 100.

In the tuner unit 52, the FM radio broadcasting wave received at the antenna 11 is supplied to the front end circuit 521. The front end circuit 521 selects a desired FM radio broadcasting wave in accordance with the selection instruction information in compliance with the selection instruction by a user from the microcomputer 70, converts it into an intermediate frequency signal and supplies the intermediate frequency signal to the intermediate frequency signal amplifier circuit 522.

The intermediate frequency amplifier circuit 522 amplifies the intermediate frequency signal and supplies it to the detection circuit 523 and the electric field detecting circuit 525. The detection circuit 523 demodulates the audio signal and supplies the demodulated audio signal to the tone control circuit 524.

The electric field strength detecting circuit 525 detects the electric field strength of the FM radio broadcasting wave in accordance with the magnitude of the intermediate frequency signal, supplies the detected output to the tone control circuit 524 as a control signal and supplies the detected output to the microcomputer 70 via the A/D conversion circuit 71.

Figure 5:
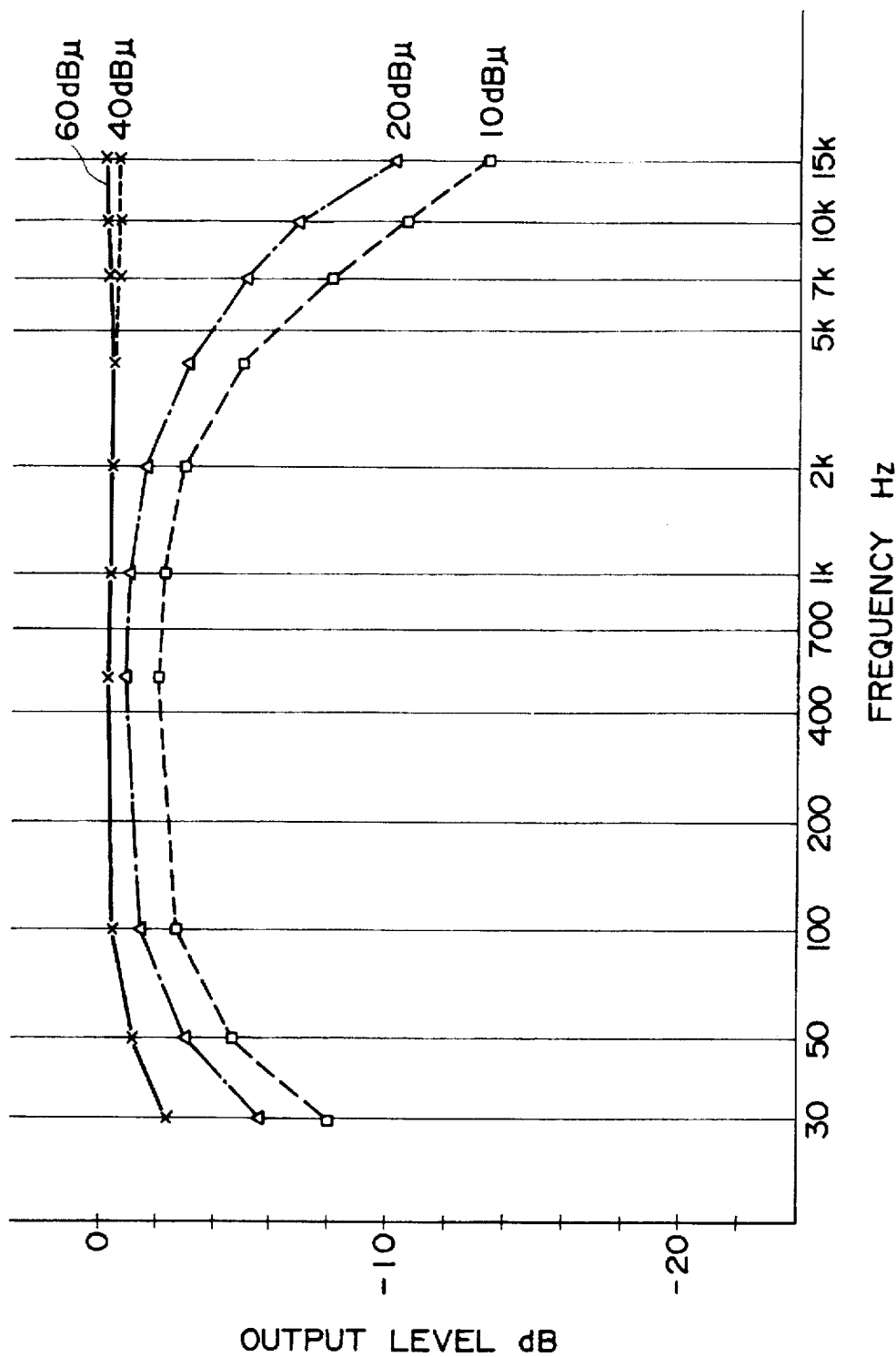
FIG. 5 is a diagram showing the frequency characteristic of a demodulated audio signal of a FM radio broadcasting.
Figure 6A:
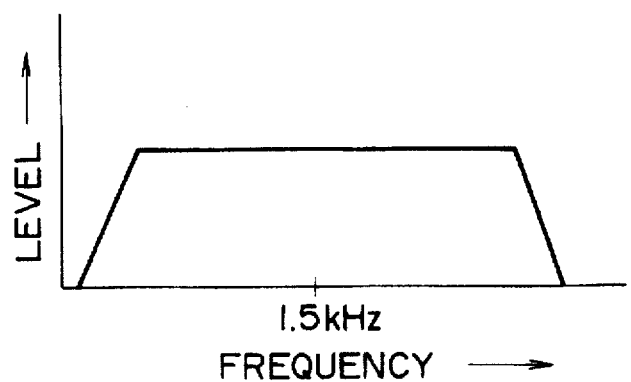
FIGS. 6A, 6B and 6C are diagrams for explaining the frequency characteristic of an audio signal that is recorded in a semiconductor memory in an automatic answering telephone set.
Figure 6B:
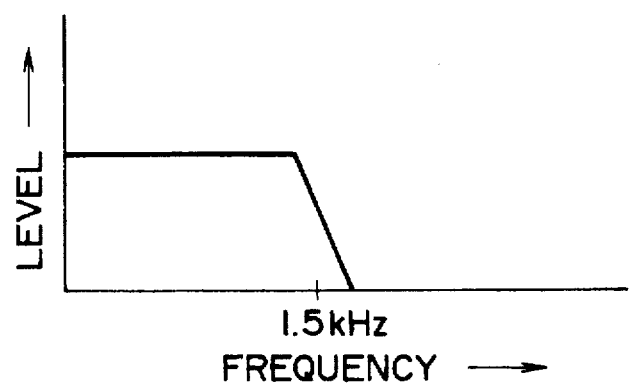
Figure 6C:
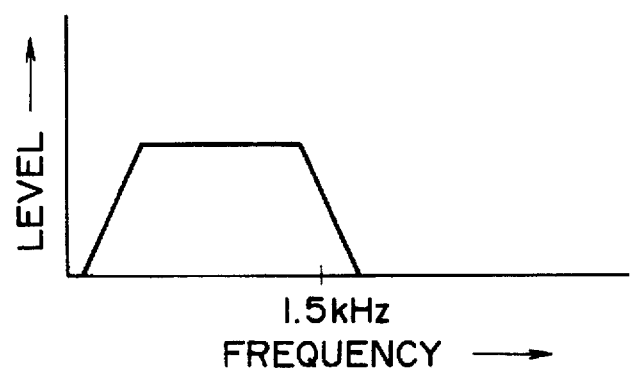
Figure 7A:
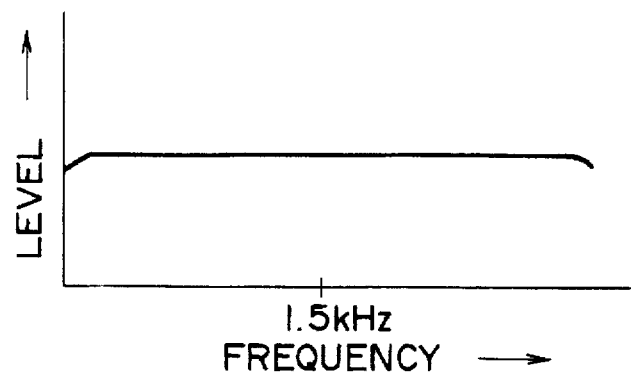
FIGS. 7A, 7B and 7C are diagrams for explaining the frequency characteristic of an audio signal in a FM radio broadcasting which is changed by being recorded in a semiconductor memory.
Figure 7B:
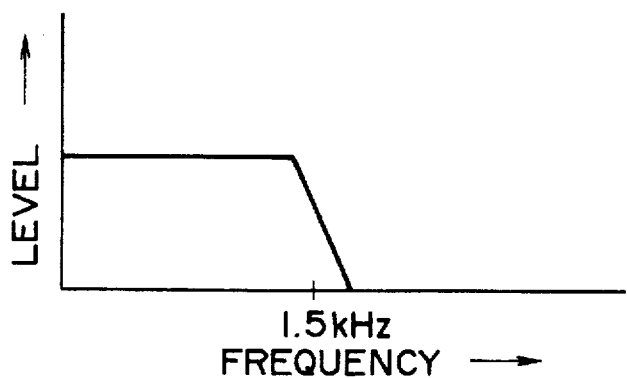
Figure 7C:
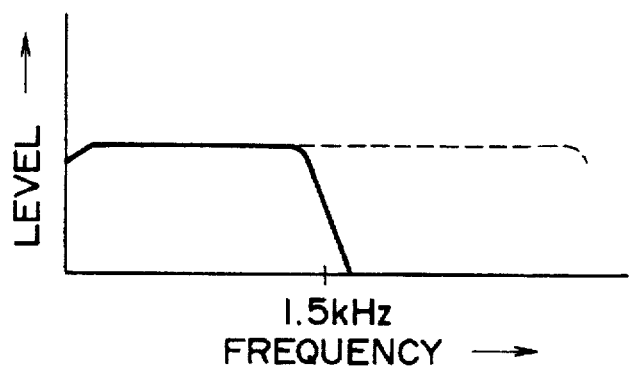

The tone control circuit 524 is provided with the frequency characteristic as shown by FIG. 5 whereby the high frequency components and the low frequency components of the audio signal from the detection circuit 523 are corrected in accordance with the result of detecting the supplied electric field strength in order to suppress the noisy feeling that is enhanced when the electric field of the received and selected FM radio broadcasting is weak.

That is, in the case of a strong electric field in which the receiving electric field strength is about 40 dBμ or more, according to the frequency characteristic of the tone control circuit 524 the attenuation of the high frequency components is not carried out and the low frequency components are attenuated by a small amount of attenuation, as shown by FIG. 5.

In the case of a weak electric field in which the receiving electric field strength is 20 dBμ or 10 dBμ, the high frequency region is cut and also the low frequency region is attenuated in consideration of a balance with the high frequency region in order to improve the noise characteristic, as shown by FIG. 5.

The tone control circuit 53 corrects the frequency characteristic of an audio signal Au3 from the tuner unit 52 by the control signal from the microcomputer 70 and in this embodiment, attenuates the low frequency region to make a balance with the high frequency region in accordance with the band limitation at the low pass filter 61 in the recording mode. Incidentally, in the case of the receiving mode, the frequency characteristic of the tone control circuit 53 is in compliance with the operational instruction by a user similar to the above-mentioned embodiment.

In the meantime, in this embodiment of the radio receiver 200, when the receiving electric field is determined to be weak at the tuner unit 52, the low frequency region has already been attenuated significantly in consideration of a balance with the cutting of the high frequency region for noise attenuation, as described above.

Accordingly, when a constant amount of attenuation is always performed with respect to the low frequency region at the tone control circuit 53 in the case of recording, the amount of attenuation on the side of the low frequency region may be excessively large, the balance may be worsened and the sound may be more deteriorated in view of the auditory feeling.

Therefore, according to this embodiment, in the case of the recording mode the microcomputer 70 refers to the information of the electric field strength from the A/D conversion circuit 71, sufficiently attenuates the low frequency region by the tone control circuit 53 when the receiving input electric field is strong, however, when the electric field is weak, the amount of attenuation with respect to the low frequency region at the tone control circuit 53 is reduced by previously anticipating the attenuation of the low frequency region at the tone control circuit 524.

Therefore, an audio signal Au4 from the tone control circuit 53 is formed in consideration not only of the attenuation of the high frequency region at the low pass filter 61 but also the limitation of the band in accordance with the electric field strength in the case of the recording mode and accordingly, the band of the audio signal outputted from the low pass filter 61 is limited into a well-balanced wave irrespective of the electric field strength. Then, such an audio signal is recorded in the memory 63.

In the case of the reproducing mode, the well-balanced and band-limited audio signal is read from the memory 63, restored to an analog signal Au5 at the D/A conversion circuit 64 and is supplied to the speaker 56 via the switch circuit 54 and the amplifier circuit 55 where it is reproduced as a sound and accordingly, a reproduced sound having an excellent auditory feeling characteristic can be provided.

Incidentally, there are broadcasting stations among FM broadcasting stations in Europe, providing RDS (Radio Data System) service whereby an aggregation of digital data concerning a broadcasting station, a program or the like is broadcasted in addition to inherent audio signals. When a RDS decoder is installed to, for example, the above-mentioned radio receiver 100 or 200 and a RDS data added to audio signals of a currently heard FM radio broadcast is sampled and decoded and an identification code (PTY code) designating the content of the program is detected as broadcasting a specific program, for example, a traffic information program, it is possible that the audio signal of the traffic information program is recorded in the memory 23 or 63 incorporated in the radio receiver 100 or 200 and only the newest traffic information is always recorded and held in the memory.

Further, there is a case where the FM radio broadcasting is not heard or a case where the traffic information program is broadcasted by other FM broadcasting station and therefore, for example, the RDS data added to the audio signals of each of the FM radio broadcasting stations is searched and the audio signal of the newest traffic information program is recorded in the memory even in the case where the FM radio broadcasting is not heard or the case where the traffic information is broadcasted in the other station.

Further, when the radio broadcasting program is heard by using the above-mentioned radio receiver 100 or 200, it is possible that the audio signal of the heard radio broadcast program is always recorded in the memory 23 or 63 and when the audio signal is recorded to the full memory capacity of the memory 23 or 63, the newest audio signal is recorded by overwriting thereby recording a predetermined period of time of the newest audio signal of the hearing radio broadcasting program to the memory 23 or 63.

In this case, when information necessary for a person has been broadcasted but has not been able to be heard accurately by the person as in the case where a notice of application for present to hearers is broadcasted in the heard radio broadcasting program but the person fails to hear it, and the like, the user can reproduce the audio signal recorded in the memory 23 or 63 by selecting the reproducing mode whereby the information necessary for the person can be obtained.

Although the explanation has been given to the case where the FM radio broadcasting for receiving is a monaural broadcasting in the above-mentioned embodiments to simplify the explanation, the present invention is applicable also to the case of a stereo broadcasting.

Although the explanation has been given to the case where the present invention is applied to a radio receiver in the above-mentioned embodiments, the present invention is not limited to a radio receiver but is applicable to, for example, electronic musical instruments and language learning instruments where an audio signal having a wide range is recorded in a memory and reproduced.

As has been explained, according to the recording and reproducing apparatus for an audio signal of the present invention, an audio signal recorded in a semiconductor memory can be reproduced in an optimum state in which both the low frequency region and the high frequency region thereof are well-balanced, by performing a frequency correction using a tone control circuit without installing a circuit exclusive for the frequency correction.

Further, according to the recording and reproducing apparatus for an audio signal of the present invention, the frequency correction can be performed in consideration of the electric field strength and an extra correcting operation of the low frequency region in accordance with a variation in the electric field strength can be dispensed with.

Accordingly, the recording and reproducing apparatus for an audio signal that is suitable for a radio receiver receiving FM radio broadcasting can be provided.

What is claimed is:

1. A recording and reproducing apparatus for an audio signal, comprising:

a receiving circuit for demodulating an audio signal by receiving and selecting a radio broadcast wave;

an electric field strength detecting circuit for detecting an electric field strength of said radio broadcast wave received and selected by said receiving circuit;

a first tone control circuit for performing frequency correction on at least a low frequency region of said audio signal demodulated by said receiving circuit in accordance with the electric field strength detected by said electric field strength detecting circuit.

a low pass filter for removing high frequency components above a predetermined frequency from said demodulated audio signal and producing a filtered audio signal;

an A/D conversion circuit for converting said filtered audio signal from said low pass filter into a digital signal;

storing means for storing a predetermined time of length said digital audio signal from said A/D conversion circuit;

a D/A conversion circuit for converting said digital signal read from said storing means into an analog signal;

a second tone control circuit provided at a stage ahead of said low pass filter and for conducting frequency correction on said demodulated audio signal such that low frequency components thereof are attenuated; and a control circuit for controlling said second tone control circuit to conduct frequency correction on said audio signal stored in said storing means in consideration of said frequency correction on said audio signal performed in said first tone control circuit and said high frequency components of said audio signal removed by said low pass filter based on the detected electric field strength by said electric field strength detecting circuit.

2. The recording and reproducing apparatus for an audio signal according claim 1, wherein said storing means comprises a semiconductor memory.

* * * * *